United States Patent [19]

Kamil

[11] Patent Number: 4,537,033
[45] Date of Patent: Aug. 27, 1985

[54] CRYOGENIC MAGNET SYSTEMS
[75] Inventor: Zvi Kamil, Tel Aviv, Israel
[73] Assignee: Elscint Ltd., Haifa, Israel
[21] Appl. No.: 579,010
[22] Filed: Feb. 10, 1984
[30] Foreign Application Priority Data
Mar. 15, 1983 [IL] Israel ........................................ 68138
[51] Int. Cl.³ ............................................ F25B 21/02
[52] U.S. Cl. ............................................ 62/3; 62/45; 62/514 R
[58] Field of Search ............................ 62/45, 514 R, 3
[56] References Cited

U.S. PATENT DOCUMENTS

| 3,358,463 | 12/1967 | Hawkins et al. | 62/514 R |
|---|---|---|---|
| 3,358,472 | 12/1967 | Klipping | 62/514 R |
| 3,518,591 | 6/1970 | Zar | 62/514 R |
| 3,611,746 | 10/1971 | Marsing et al. | 62/514 R |
| 4,291,541 | 9/1981 | Kneip, Jr. et al. | 62/514 R |

Primary Examiner—Ronald C. Capossela
Attorney, Agent, or Firm—Sandler & Greenblum

[57] ABSTRACT

Improved cryogenic magnet systems for use in NMR imaging devices comprising an electro-magnet immersed in a first tank containing a first liquid gas, the first tank located in a container evacuated to a high vacuum, a refrigerating system external to said container, and coupling means for coupling a cold head of the refrigerating system to radiation shielding means surrounding said first tank for lowering the temperature of the shielding means to thereby reduce boil-off of said liquid gas.

14 Claims, 2 Drawing Figures

CRYOGENIC MAGNET SYSTEMS

FIELD OF THE INVENTION

This invention is concerned with NMR diagnostic imaging devices and more particularly with cryogenic magnet systems for use in such devices.

BACKGROUND OF THE INVENTION

Super-conductive magnet systems are used in many of the presently available and proposed NMR diagnostic imaging devices. Liquid helium is used to cool the electro-magnets to the low temperature required. One of the problems with liquid helium cooled systems is that low temperature is maintained by the "Boil Off" of the liquid helium that occurs when its temperature reaches 4.2 Kelvin (at atmospheric pressure). Due to the "Boil Off" the helium has to be replaced at frequent intervals. Thus, costly and bothersome replacement of the helium is required after relatively short time periods.

An apparent solution is to use a liquifier to recompress the boiled off liquid helium. However, such liquifiers are large, unwieldly and expensive units.

A proposed solution is to reduce the amount of liquid helium boiled off by lowering the temperature of a radiation shield surrounding the liquid helium tank.

In theory, such solutions sound promising. However, there are many practical problems involved. The problems have to be solved if there is to be a cryogenic cooler available that can be lowered to a low enough temperature so as to efficiently reduce the temperature difference between the shield and the helium container.

BRIEF DESCRIPTION OF THE INVENTION

According to the present invention, improved cryogenic magnet systems for use in NMR diagnostic imaging devices are provided, said systems comprising:

an electro-magnet immersed in a first tank containing a first liquid gas, the said first tank located in an evacuated container that is evacuated to a high vacuum, a refrigerating system external to said first tank, radiation shield means surrounding said first tank, coupling means including refrigerant carrying hand means for coupling the refrigerant of said refrigerating system to remove heat from the radiation shield means, and said coupling means including resilient mesh means for increasing the contiguous area of coupling between the refrigerant carrying means and the shield means for assuring good heat transfer between the refrigerant and the shield.

A feature of the invention is the use of the magnetic force for connecting the coupling means to the radiation shield.

The invention enables improved cryogenic magnet systems that avoid the time consuming and expensive almost monthly helium replacement that have been required with prior art systems. The present system can work efficiently for about a year without having to replace the liquid helium or liquid nitrogen commonly used in such systems.

BRIEF DESCRIPTION OF THE DRAWINGS

The above mentioned objects and features of the present invention will be better understood when considered in connection with the following description of some preferred embodiments of the present invention made in conjunction with the accompanying drawings, wherein.

GENERAL DESCRIPTION

Figure 1:
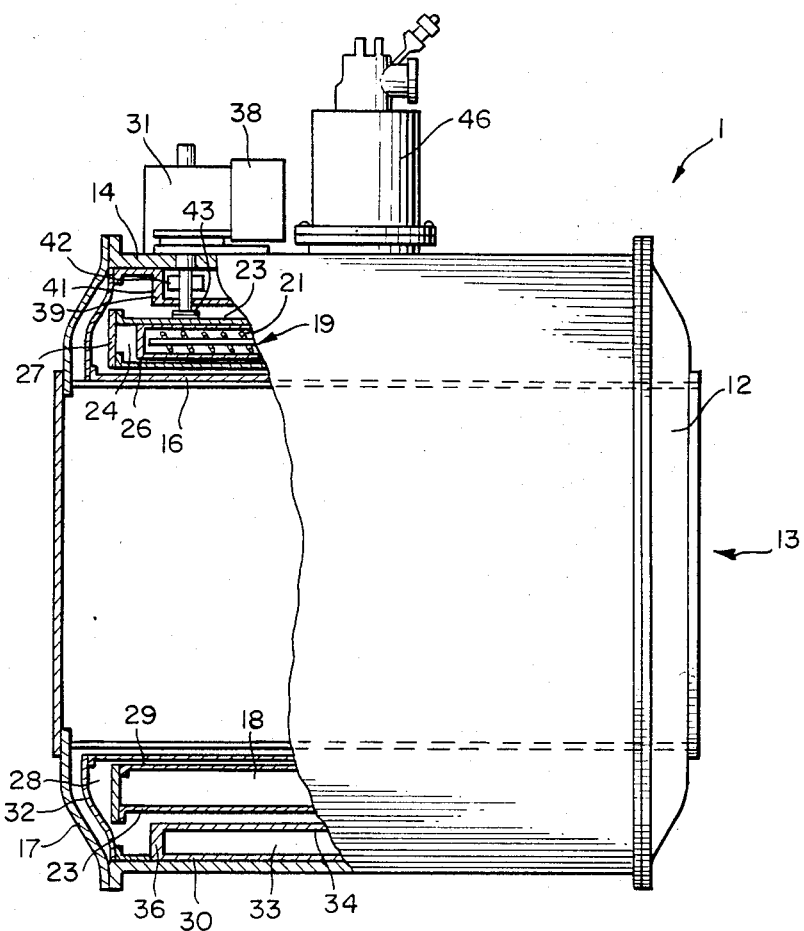
FIG. 1 is "break-away" side view of the cryogenic magnetic system showing some of the major component parts.

The improved cryogenic magnet system 1 of FIG. 1 comprises an outer shell 12 that approximates a hollow cylinder. The bore or cylindrical volume 13 between the dashed lines is hollow. The patient or subject is placed into this space to obtain the NMR images. Thus, the outer shell 12 encompasses two cylindrical room temperature bore tubes 14 and 16. The tubes are joined by means such as end spinning 17.

A first hollow cylindrical tank 18 is substantially filled with a first liquid gas, helium is the preferred gas for this tank. The tank also contains the super conducting electro-magnet, indicated generally at 19.

The superconducting magnet 19 comprises a coil made of windings of superconducting wire 21 which at low temperature, as is well known, reduce the resistance in the coil to zero. Once the coil is energized to a desired magnetic field, a superconducting switch is turned on, the power is turned off and the electromagnet maintains its magnetism practically indefinitely.

The helium tank 18 is surrounded by a vacuum since it is located in a vacuum chamber defined by the room temperature bore tubes. Radiation shield tubes 23 and 26 and the radiation shield end plate 27 form a heat shielded chamber 24 for the helium tank. Another container 28 comprised of tubes 29 and 30 joined by end spinning 32 surrounds the radiation shielded container. Integral to tube 30 is the nitrogen tank 33 defined by tube 30 and inner wall 34 with integral end piece 36.

Figure 2:
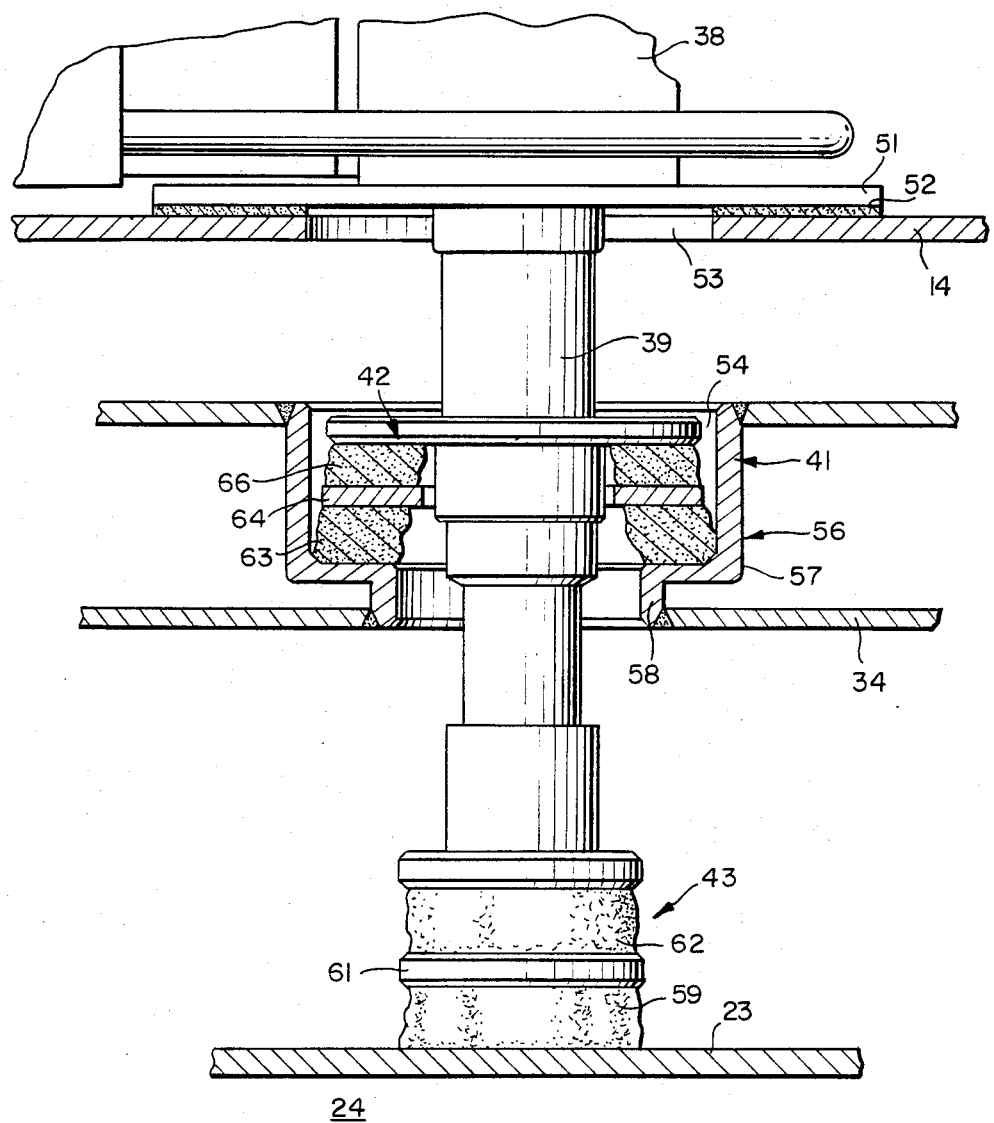
FIG. 2 is a sectional view of the system of FIG. 1 showing details of the mechanical and thermo coupling between the external refrigerating unit and the inner liquid gas tanks.

The cooling of the radiation shield in the preferred embodiment is accomplished not only by the boiling off of the liquid helium but also through conduction using external refrigerator units, such as shown in detail in FIG. 2. The external refrigerator is shown in general in FIG. 1 at 31.

The external refrigerator 31 is of a type that is a readily commercially available closed cycle cryogenic refrigerator comprising a compressor 38 and the cold head 39. The cold head carries the refrigerant which may also be liquid helium to a position abutting the radiation shield surrounding the liquid helium tank 18.

A nitrogen tank penetration chamber 41 is formed in the nitrogen tank. The cold head 39 extends through this chamber thereby preserving the integrity of the nitrogen tank. A heat transfer means 42 abuts the nitrogen tank to also remove heat therefrom.

A heat transfer means 43 abutting the radiation shield is described in greater detail in connection with FIG. 2.

It should be noted that a service turret 46 is provided to provide the liquid gases used as well as to connect the super-conducting coil to a source of electrical power.

Means are provided for insuring the integrity of the vacuum in the chamber defined by room temperature bore tubes 14 and 16. More particularly the refrigerator unit is coupled to tube 14 by fastener means (not shown) that couple a plate 51 and gasket 52 to seal the aperture 53 in tube 14.

Further means are provided for preserving the integrity of the nitrogen tank defined by tubes 30 and 34. More particularly an inviolate passageway 41 is fabricated extending through the nitrogen tank. In cross-section the passageway 41 is defined by portion 56 having a wider first section 57 and a narrower second section 58.

The heat transfer between radiation shielded chamber 24 and the cold head 39 is facilitated by heat conducting means. More particularly, the head 39 is joined to shield tube 23 by a sponge-like material such as heat conducting copper wool ("steel wool") for example shown at 59. To assure the forced juxtaposition of the heat transfer or conducting means 59 against the radiation shield tube 23 a plate 61 of magnetizeable material is provided. The plate 61 is attached to another layer of heat transferring material 62.

The magnetic forces also pull on the cold head to assure that good abuttment and heat transfer is accomplished at mesh 63, plate 64 and mesh 66. Note that the meshes ("steel wool") could be either magnetizeable or non-magnetizeable material but of good head conducting properties within the scope of the invention.

Means are provided for removing the external heat transfer means without breaking the vacuum seal which would cause the liquid gases to boil away. More particularly a bellows arrangement and valve means may be used for removing the cold head and retaining the vacuum. When the cold head is above the valve, it is closed off to preserve the vacuum.

While the invention has been explained with reference to certain exemplary embodiments, it should be understood that the invention is not to be limited by the description but is defined by the appended claims.

What is claimed is:

1. An improved cryogenic superconductive magnet system for use in nuclear magnetic resonance (NMR) devices, said system comprising:
    (a) a cryogenic superconducting electro-magnet immersed in a first tank containing a first liquified gas;
    (b) said first tank being mounted in a vacuum container;
    (c) heat radiation shielding means surrounding said first tank in said vacuum container;
    (d) a refrigerator system external to said vacuum container, said refrigerator system including refrigerant means, and means for compressing said refrigerant means;
    (e) coupling means comprising cold head means for carrying said compressed refrigerant means to said heat radiation shielding means to remove heat from said heat radiation shielding means; and
    (f) said cold head means comprising heat transferrable mesh means attached to said cold head means to be between said cold head means and said heat shielding means and in contact with said heat shielding means for increasing the area of direct contiguity between said cold head means and said heat shielding means.

2. The system of claim 1 wherein means are provided for removing the cold head without violating the integrity of the vacuum.

3. The system of claim 2 wherein said means for removing the cold head includes bellows.

4. The system of claim 2 wherein said means for removing said cold head includes valve means.

5. The system of claim 1 including a second liquid tank means surrounding said radiation shield means.

6. The system of claim 5 wherein said first liquid gas is helium.

7. The system of claim 6 wherein the second liquid gas is nitrogen.

8. The system of claim 5 wherein means are provided for said cold head to traverse said liquid nitrogen tank.

9. The system of claim 8 wherein said transversing means comprising inviolate passage means.

10. The improved cryogenic superconducting magnet system of claim 1 wherein said mesh means is resilient to thereby improve contiguity between said cold head means and said heat radiation shielding means.

11. An improved cryogenic system providing a cold environment for superconducting magnets for use in NMR devices, said system comprising:
    (a) an electro-magnet immersed in a first tank containing a first liquified gas, the boil off of said liquified gas used for maintaining low temperatures required for superconducting electro-magnets;
    (b) said first tank being mounted in a vacuum container;
    (c) heat radiation shielding means in said vacuum container surrounding said first tank;
    (d) a refrigerator system external to said vacuum container;
    (e) coupling means for coupling a cold head of said external refrigerator system to said shielding means for lowering the temperature of said heat radiation shielding means to reduce boil off of the first liquified gas; and
    (f) means for utilizing the magnet force of the magnet of the NMR system to assure abutment between the cold head and the heat radiation shielding means.

12. The system of claim 11 wherein said cold head includes metal wool means juxtaposed to said radiation shield and magnetizeable plate means for forcing said metal wool means against said radiation shield means, said metal wool means being a good heat conductor.

13. The system of claim 12 wherein said metal wool means is firmly attached to said cold head to pull said cold head responsive to magnetic forces.

14. The system of claim 11 wherein said metal wool means is of magnetizeable material.

* * * * *